United States Patent
Huang et al.

(10) Patent No.: US 9,905,542 B2
(45) Date of Patent: Feb. 27, 2018

(54) LED LIGHT BAR MANUFACTURING METHOD AND LED LIGHT BAR

(71) Applicant: SUZHOU DONGSHAN PRECISION MANUFACTURING CO., LTD., Suzhou, Jiangsu (CN)

(72) Inventors: Yongxin Huang, Suzhou (CN); Peng Yang, Suzhou (CN); Guolin Chong, Suzhou (CN); Yonggang Yuan, Suzhou (CN)

(73) Assignee: SUZHOU DONGSHAN PRECISION MANUFACTURING CO., LTD., Suzhou, Jiangsu (CN)

( * ) Notice: Subject to any disclaimer, the term of this patent is extended or adjusted under 35 U.S.C. 154(b) by 0 days.

(21) Appl. No.: 15/127,115

(22) PCT Filed: May 27, 2014

(86) PCT No.: PCT/CN2014/078516
§ 371 (c)(1),
(2) Date: Sep. 19, 2016

(87) PCT Pub. No.: WO2015/139369
PCT Pub. Date: Sep. 24, 2015

(65) Prior Publication Data
US 2017/0110443 A1    Apr. 20, 2017

(30) Foreign Application Priority Data
Mar. 21, 2014 (CN) .......................... 2014 1 0108679

(51) Int. Cl.
*H01L 23/00* (2006.01)
*H01L 25/00* (2006.01)
(Continued)

(52) U.S. Cl.
CPC .......... *H01L 25/0753* (2013.01); *H01L 24/97* (2013.01); *H01L 25/50* (2013.01);
(Continued)

(58) Field of Classification Search
CPC ....... H01L 24/97; H01L 25/50; H01L 33/507; H01L 33/54
See application file for complete search history.

(56) References Cited

U.S. PATENT DOCUMENTS

| | | |
|---|---|---|
| 2008/0121899 A1 | 5/2008 | Pires et al. |
| 2011/0109235 A1 | 5/2011 | Link |

(Continued)

FOREIGN PATENT DOCUMENTS

| | | |
|---|---|---|
| CN | 101546756 A | 9/2009 |
| CN | 102185048 A | 9/2011 |

(Continued)

OTHER PUBLICATIONS

State Intellectual Property Office as the International Searching Authority, International Search Report for PCT Application No. PCT/CN2014/078516, dated Dec. 24, 2014.
European Patent Office, Extended European Search Report for EP Application No. 14885975.4, dated Aug. 21, 2017.
Japan Patent Office, Notification of Reasons for Refusal for JP Application No. 2016558132, dated Nov. 7, 2017.

*Primary Examiner* — Marcos D Pizarro Crespo
*Assistant Examiner* — Long H Le
(74) *Attorney, Agent, or Firm* — Honigman Miller Schwartz and Cohn LLP; Matthew H. Szalach; Jonathan P. O'Brien

(57) ABSTRACT

A method for fabricating an LED light bar and an LED light bar are provided. The method includes: providing a transparent base, wherein at least one framework region for fixing LED chips is arranged on the transparent base, at least one milling groove parallel to the framework region is arranged at each of two sides of each framework region; arranging one or more LED chips on the at least one framework (Continued)

region; covering an upper surface and a lower surface of the transparent base where the LED chips are arranged with a packaging adhesive mixed with fluorescent powder, and filling up the milling groove with the packaging adhesive; and cutting the transparent base along the milling groove, to obtain an LED light bar surrounded by the adhesive.

7 Claims, 4 Drawing Sheets

(51) Int. Cl.
    *H01L 25/075*    (2006.01)
    *H01L 33/50*    (2010.01)
    *H01L 33/54*    (2010.01)

(52) U.S. Cl.
    CPC .......... *H01L 33/505* (2013.01); *H01L 33/507* (2013.01); *H01L 33/54* (2013.01); *H01L 33/501* (2013.01); *H01L 2933/005* (2013.01); *H01L 2933/0033* (2013.01); *H01L 2933/0041* (2013.01)

(56) References Cited

U.S. PATENT DOCUMENTS

| | | | |
|---|---|---|---|
| 2013/0120967 A1 | 5/2013 | Liao | |
| 2014/0369036 A1* | 12/2014 | Feng | F21K 9/23 362/223 |
| 2015/0117012 A1* | 4/2015 | Kuo | F21K 9/135 362/293 |

FOREIGN PATENT DOCUMENTS

| | | |
|---|---|---|
| CN | 202196812 U | 4/2012 |
| CN | 202585529 U | 12/2012 |
| CN | 202868390 U | 4/2013 |
| CN | 103107169 A | 5/2013 |
| CN | 103187514 A | 7/2013 |
| CN | 103199179 A | 7/2013 |
| CN | 103322525 A | 9/2013 |
| CN | 103325927 A | 9/2013 |
| CN | 103500742 A | 1/2014 |
| CN | 103560194 A | 2/2014 |
| CN | 203434200 U | 2/2014 |
| JP | 2001217464 A | 8/2001 |
| JP | 2010097917 A | 4/2010 |
| JP | 2012191114 A | 10/2012 |

* cited by examiner

LED LIGHT BAR MANUFACTURING METHOD AND LED LIGHT BAR

This application is the national phase of International Application No. PCT/CN2014/078516, titled "LED LIGHT BAR MANUFACTURING METHOD AND LED LIGHT BAR," filed on May 27, 2014, which claims priority to Chinese Patent Application No. 201410108679.6, titled "METHOD FOR FABRICATING LED LIGHT BAR AND LED LIGHT BAR," filed with the Chinese State Intellectual Property Office on Mar. 21, 2014, the disclosures of which are hereby incorporated by reference in their entireties.

FIELD

The present disclosure relates to the technical field of light emitting diode (LED) packaging, and in particular to a method for fabricating an LED light bar and a LED light bar.

BACKGROUND

A light emitting diode (LED) can directly convert electric energy into light energy. An LED chip includes a P-type semiconductor in which holes dominate and an N-type semiconductor in which electrons dominate. A "P-N junction" is formed between the P-type semiconductor and the N-type semiconductor when the two semiconductors are connected. The principle of light emission of the LED is that when a current is applied to the chip via a conductive wire, the electrons are pushed to the P-type region and are recombined with the holes in the P-type region, such that energy is emitted in a form of photons. The LED, as a new light source, has been widely used in the lighting field due to its feature of energy saving, environmental protection and a long life. The Nichia Chemical in Japan has patent applications for a blue-light LED with a substrate made of sapphire, application numbers of which are JP19960198585, 19960244339, JP19960245381, JP19960359004 and JP19970081010. The LED chip with a sapphire substrate emits light in a solid angle of 360 degrees, and a current LED packaging light source is a single-side light source, which requires a reflective substrate reflecting lights emitted from a back side and a lateral side of the LED chip, such that the reflected lights are emitted from a front surface. In this case, a large portion of the lights is absorbed by a material due to multiple reflections, thereby reducing overall luminous flux of the LED packaging light source and limiting improvement of light effect of the LED light source.

Therefore, a LED light emitting device which emits lights from two sides is provided. With reference to FIGS. 1A to 1E, a main fabrication idea of the LED light emitting device is described as follows.

A transparent base 10 is provided. Multiple columns of LED chips are arranged on the transparent base 10 by a die bonding process and multiple LED chips 11 are arranged on each column. By a wire-bonding process, in a same column, a pad of a positive electrode on a surface of an LED chip is connected to a pad of a negative electrode on a surface of an LED chip adjacent to the LED chip via a conductive wire 12. The whole transparent base 10 is placed into a mould 15. A mixture 14 including a fluorescent powder and a packaging adhesive is attached on a front surface and a back surface of the transparent surface 10 by a molding process. The multiple columns of LED chips are cut into light bars 16 each including one column of LED chips.

In the LED light bar fabricated by the above method, since the transparent base is used in conjunction with the LED chip having a transparent substrate, a front surface and a back surface of the light bar each can emit lights, thereby improving a light utilization efficiency of the LED.

However, the LED light bar has the following two problems.

Since the packaging adhesive covers the front surface and the back surface of the transparent base, after the transparent base is cut into the LED light bars, lateral surfaces of the LED light bar can not be covered by the packaging adhesive. In this case, lights leak from the lateral surfaces of the LED light bar, thereby affecting overall uniformity of light emitting of the LED light bar.

In addition, based on the above problem, LED manufacturers always increase the amount of fluorescent powder to reduce a color temperature at a position where the LED bar leaks lights, to meet a customer's requirement for a color temperature of the whole LED light bar. Taking a blue-light LED chip as an example, since a color temperature of blue lights leaking from the lateral surfaces is much greater than a color temperature of lights emitted from the front and back surfaces, the overall color temperature of the LED light bar is increased. Therefore, in order to reduce the color temperature of the LED light bar, the manufacturers have to use more fluorescent powder in the LED light bar, which increases the cost, and affects a light emitting effect of the front and back surfaces of the LED light bar.

Therefore, in the industry, the lateral-surface light leakage of the LED light bar is an urgent problem to be solved.

SUMMARY

The present disclosure is to provide a method for fabricating an LED light bar surrounded by an adhesive and an LED light bar, to solve a problem of non-uniformity of light emitting caused by lateral-surface light leakage, and to reduce usage amount of fluorescent powder and production cost.

A method for fabricating an LED light bar is provided according to the object of the present disclosure, which includes:

providing a transparent base, where at least one framework region for fixing LED chips is arranged on the transparent base, at least one milling groove parallel to the framework region is arranged at each of two sides of each framework region, and the milling groove penetrates through an upper surface and a lower surface of the transparent base;

arranging one or more LED chips on the at least one framework region by a die bonding process, where LED chips on a same one framework region form an LED chip column;

connecting, in a same LED chip column, a positive electrode of an LED chip to a negative electrode of an LED chip adjacent to the LED chip by a wire bonding process;

covering, by a press molding process, an upper surface and a lower surface of the transparent base where the LED chips are arranged with a packaging adhesive mixed with fluorescent powder, and filling up, by the press molding process, the milling groove with the packaging adhesive under pressure; and cutting the transparent base along the milling groove after the packaging adhesive is solidified, to obtain an LED light bar surrounded by the adhesive.

Preferably, the at least one milling groove and the at least one framework region are arranged alternately, alternatively, two milling grooves are arranged on each of two sides of each framework region.

Preferably, the length of the milling groove is greater than or equal to the length of the framework region.

Preferably, the milling groove is integrally formed with the transparent base by mould casting, or the milling groove is formed by post-processing of the transparent base through a grooving process.

Preferably, the transparent base is cut along a length direction of the milling groove, and a cutting trajectory coincides with a midline of the milling groove in the length direction.

Preferably, the transparent base is one of a transparent glass plate, a transparent resin plate, a sapphire base or a transparent ceramic.

An LED light bar surrounded by an adhesive fabricated by the above method is further provided.

Preferably, the at least one milling groove and the at least one framework region are arranged alternately, or two milling grooves are arranged on each of two sides of each framework region.

Preferably, the length of the milling groove is greater than or equal to the length of the framework region.

Preferably, the milling groove is integrally formed with the transparent base by mould casting, or the milling groove is formed by post-processing of the transparent base through a grooving process.

As compared with the conventional technology, the present disclosure has the following two advantages.

The LED light bar according to the present disclosure are surrounded by the adhesive, such that the problem of lateral-surface light leakage is solved completely, and lights are uniformly emitted from all sides of the light bar, thus the LED light bar has a good light emitting effect.

In the method according to the present disclosure, production efficiency is high since the press molding process is used, blue lights does not leak from the lateral surfaces, and less fluorescent powder is used (in a case that the adhesive covers two sides, the blue lights may leak from the lateral surfaces, and the emitted lights may be mixed with the blue lights, the usage amount of fluorescent powder is increased in upper and lower adhesives to counteract the blue lights emitted from the lateral surfaces, to meet a requirement for a color temperature; in a case that all sides are covered by the adhesive, the lateral surfaces are covered by a mixture of the fluorescent powder and the adhesive, the (same) requirement for the color temperature may be satisfied without additionally increasing the usage amount of the fluorescent powder), thereby reducing the cost.

BRIEF DESCRIPTION OF THE DRAWINGS

To illustrate technical solutions according to embodiments of the disclosure or in the conventional technology more clearly, the following briefly describes the drawings according to embodiments of the disclosure. Apparently, the drawings are only some embodiments of the present disclosure, and other drawings may be obtained by those skilled in the art according to those drawings without creative efforts.

DETAILED DESCRIPTION OF EMBODIMENTS

Figure 1A:
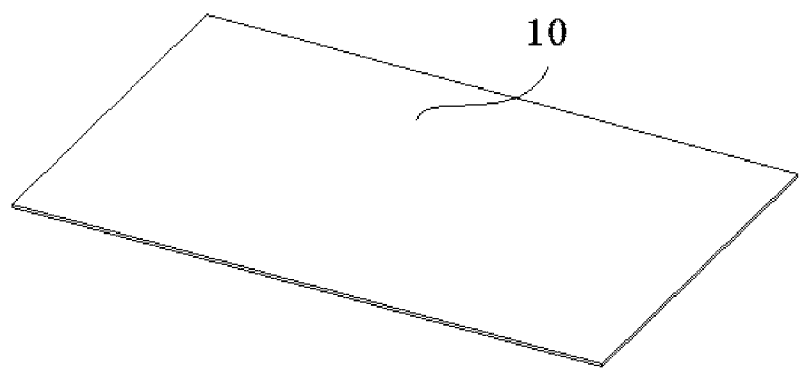
FIGS. 1A to 1E are schematic flow diagrams of a conventional method for fabricating an LED light bar.
Figure 1B:
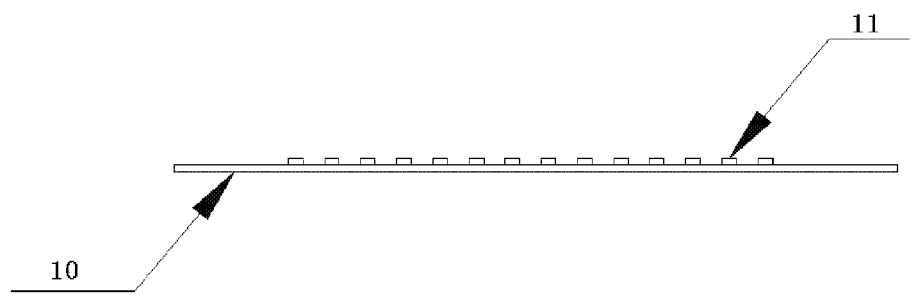
Figure 1C:
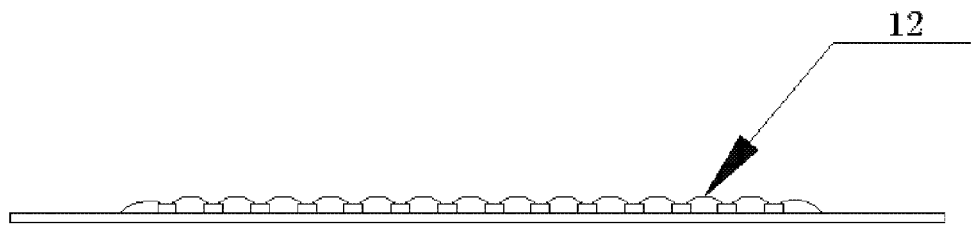
Figure 1D:
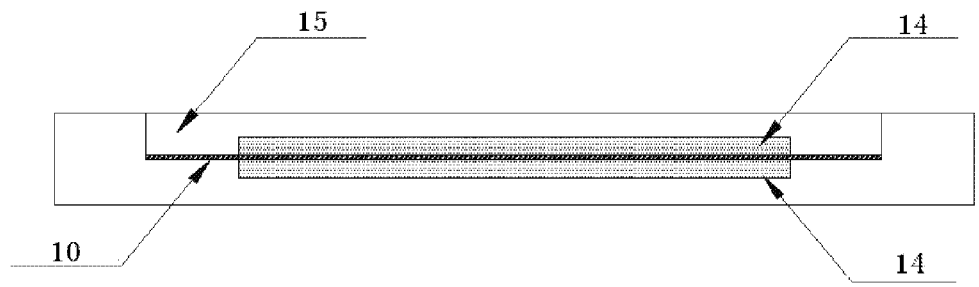
Figure 1E:
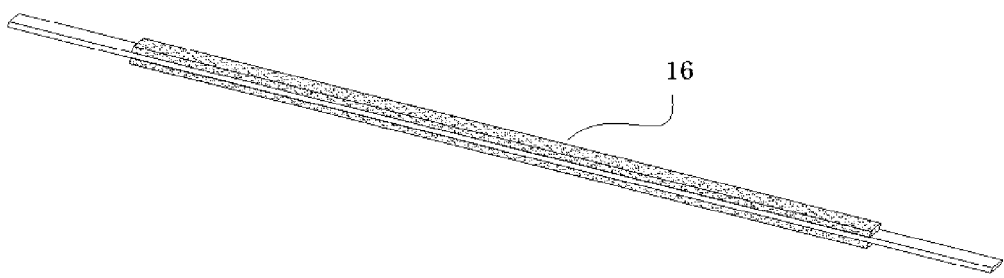

The technical solutions of embodiments of the disclosure will be illustrated clearly and completely in conjunction with the drawings of the embodiments of the disclosure. Apparently, the described embodiments are only a few embodiments rather than all embodiments of the disclosure. Any other embodiments obtained by those skilled in the art on the basis of the embodiments of the present disclosure without creative work will fall within the scope of the present disclosure.

To understand the object, features and the technical effects of the disclosure more clearly, the embodiments of the disclosure will be described below in conjunction with the drawings.

As described in the Background section, a traditional LED light emitting device has a low light utilization rate since lights are emitted for only one side of the LED light emitting device. In the conventional technology, in order to improve the light utilization rate, an LED light emitting light bar in which lights are emitted from two sides are provided. In the LED light emitting light bar, a transparent base is used in conjunction with an LED chip having a transparent substrate, and an upper surface and a lower surface of the transparent base are covered with a packaging adhesive mixed with a fluorescent powder, such that lights are emitted from two sides of the LED light emitting light bar. In the conventional technology, however, in a process of fabricating the LED light emitting light bar, the packaging adhesive covers the upper and lower surfaces of the transparent base from the front side and back side of the transparent base respectively, such that after the transparent based is cut, cutting surfaces, i.e. lateral surfaces of the LED light bar, are not covered by the packaging adhesive. In the case, lights leak from the lateral surfaces of the LED, thus uniformity of light emitting of LED is affected, and production cost is increased, since manufacturers have to add more fluorescent powder to solve the problem of increasement of a color temperature caused by lateral-surface light leakage.

In view of this, a method for fabricating an LED light bar all sides of which are covered by a packaging adhesive is provided. The technical solutions of the present disclosure are as follows. A transparent base is specially processed, and multiple milling grooves penetrating through an upper surface and a lower surface of the transparent base are formed on the transparent base. The milling grooves are arranged corresponding to LED chip columns, and at each of two sides of each LED chip column, at least one milling groove is arranged. In a process of packaging, a portion of the packaging adhesive enters into and fills up the milling grooves under pressure of upper and low pressing mould. In this case, the packaging adhesive not only covers an upper surface and a lower surface of the transparent base where the LED chips are located, and also fills up the milling grooves at two sides of each LED chip column. In this case, when the transparent base is cut, an LED light bar surrounded by adhesive can be obtained as long as the transparent base is cut along the milling grooves, thereby overcoming a defect of the lateral-surface light leakage of the LED light bar fabricated by the conventional processes.

In the following, the technical solutions of the present disclosure are described in detail.

Reference is made to FIGS. 2A to 2E which are schematic flow diagrams of a method for fabricating an LED light bar according to the present disclosure. As shown in FIGS. 2A to 2E, the method mainly includes the following steps.

A transparent base 20 is provided, at least one framework region 21 for fixing LED chips is arranged on the transparent base 20, and at least one milling groove 22 parallel to the framework region 21 is arranged at each of two sides of each of the at least one framework region 21, and the milling groove 22 penetrates through an upper surface and a lower surface of the transparent base 20.

The transparent base 20 may be a transparent crystal such as a transparent glass plate, a transparent resin plate, a sapphire base and a transparent ceramic. The transparent base 20 is required to have a transmissivity for lights with a wavelength ranging from 400 nm to 750 nm in visible band, where the transimissivity is greater than or equal to 50%, and preferably, greater than or equal to 70%.

The milling groove 22 may be integrally formed with the transparent base 20 by mould casting in a process of fabricating the transparent base 20. Alternatively, the milling groove 22 may be formed by post-processing of the transparent base through a grooving process such as punching and laser cutting after the transparent base 20 is formed. The milling groove is arranged matching with the framework regions 21.

In an optimal embodiment, the at least one milling groove 22 and the at least one framework region 21 are arranged alternately. In this case, the requirement that one milling groove is arranged at each of two sides of each framework region 21 is satisfied, such that cutting spaces are provided for a subsequent cutting process, and the number of milling grooves is reduced such that a space utilization of the transparent base 20 is maximized.

In other embodiments, two milling grooves may be arranged at each of two sides of each framework region 21. It should be noted that, regardless of the arrangements for the framework regions and the milling grooves, the length of the milling groove 22 is required to be greater than or equal to the length of the framework region 21. The width of the milling groove depends on the amount of lights emitted from lateral surfaces of the LED light bar and usage amount of fluorescent powder after the LED light bar is formed, since the thickness of the packaging adhesive on the lateral surfaces of the LED light bar is approximately equal to a half of the width of the milling groove after the transparent base is cut. For example, if the amount of lights emitted from the lateral surfaces of the LED light bar is large, a large amount of fluorescent powder is needed, with a constant intensity of fluorescent powder mixed into the packaging adhesive, generally, lights emitted from the LED are adjusted by controlling the thickness of the packaging adhesive, and in this case, the thickness of the packaging adhesive is large. Or, if lights emitted from the lateral surfaces of the LED light bar are weak, the thickness of the packaging adhesive may be appropriately thinned. Alternatively, the lights emitted from the lateral surfaces may be adjusted by changing the usage amount of the fluorescent powder and fixing the thickness of the packaging adhesive. In this case, the width of the milling groove may be set as a certain standard value, thereby facilitating opening mould and a batch production.

Figure 2A:
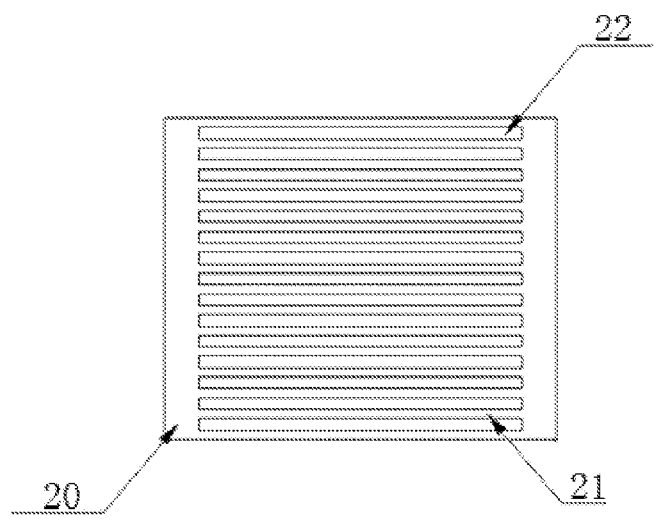
FIGS. 2A to 2E are schematic flow diagrams of a method for fabricating an LED light bar according to the present disclosure.
Figure 2B:
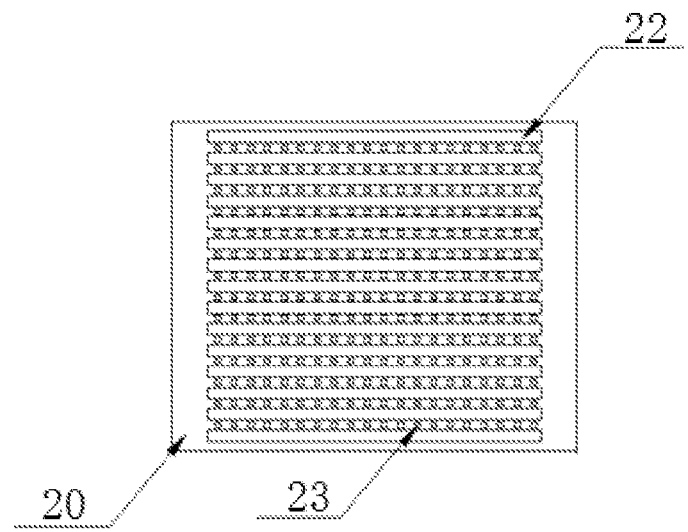

One or more LED chips 23 are arranged on the at least one framework region 21 with a die bonding process. As shown in FIG. 2B, LED chips 23 located on a sane framework region 21 generally form an LED chip column.

In a process of die bonding, the LED chips are fixed on the framework region 21 of the transparent base 20 by a transparent adhesive such as silica gel. More than one LED chip 23 is arranged on each of the framework region 21, and the LED chips are arranged in a column along the framework region 21. In some special applications, multiple LED chip columns may be formed on one framework region 21, thereby improving luminance of lights emitted from the LED light bar. It should be noted that, besides the LED chips 23, a conductive wire electrically connecting the LED chips to the outside may also be arranged. The conductive wire is arranged on the transparent base 20 by film coating or welding, and preferably, the conductive wire is also made of a transparent conductive material.

Figure 2C:
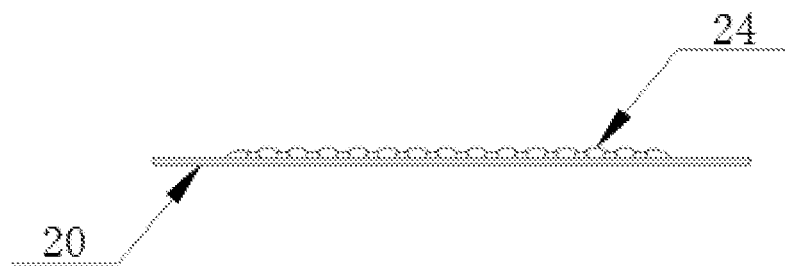

As shown in FIG. 2C, in a same LED chip column, a positive electrode of an LED chip 23 is connected to a negative electrode of an LED chip 23 adjacent thereto by a wire bonding process. A bonding wire 24 is preferably made of a golden line to ensure a conductive performance between the LED chips 23. LED chips in each column may be connected in series or in parallel. All LED chips in the column may be electrically connected to a conductive electrode arranged outside of the framework region 21 by the bonding wire 24.

Figure 2D:
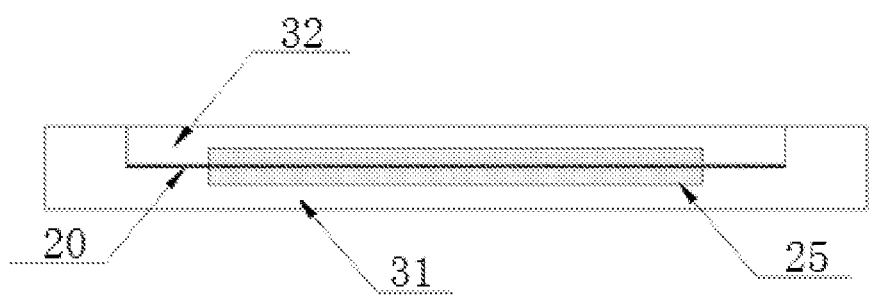

A packaging adhesive 25 mixed with fluorescent powder covers, by a press molding process, an upper surface and a lower surface of the transparent base where the LED chips are arranged, the packaging adhesive 25 may fill up all milling grooves under the pressure, as shown in FIG. 2D. An upper pressing mould and a lower pressing mould are used in the press molding process. The transparent base 20 is placed on the lower pressing mould 31, where a recess for fixing the transparent base 20 is arranged on the lower pressing mould, and there is at least one step with a height greater than the height of the LED chip in the recess, to ensure that the portion of the recess accommodating the LED chips can still be hollow after the transparent base 20 is placed into the recess. A chamber for injecting the packaging adhesive into the recess is further arranged in the lower pressing mould 31. The upper pressing mould can match the recess in the lower pressing mould. After the transparent base 20 is placed into the lower pressing mould 31, the upper pressing mould 32 presses the lower pressing mould 31, and the packaging adhesive 25 fills the recess, covers the upper surface and the lower surface of the transparent base 20 and enters the milling groove under the pressure. The fluorescent powder is mixed into the packaging adhesive 25, and the kind of fluorescent powder is determined according to a color of light source to be emitted by the LED. For example, for a white-light LED, a yellow fluorescent powder is used if a blue-light LED chip is used.

Figure 2E:
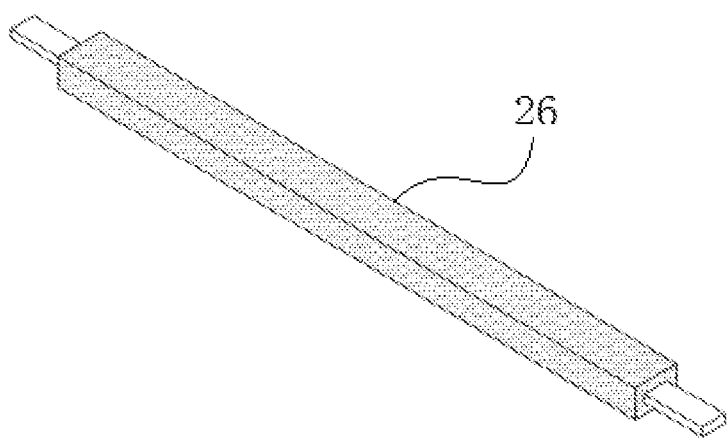

The transparent base is cut along the milling groove after the packaging adhesive is solidified, to obtain an LED light bar surrounded by the adhesive, as shown in FIG. 2E. The transparent base is cut along a length direction of the milling groove, and a cutting trajectory coincides with a midline of the milling groove in the length direction substantially. Since the transparent base 20 is surrounded by the packaging adhesive, a special cutting device is required. The cutting device has a positioning device capable of positioning the packaged transparent base, and the positioning device may determine the cutting trajectory based on the location of the milling groove on the transparent base, thereby ensuring that a cutting line is strictly consistent with the midline of the milling groove. It should be noted that, the length of the obtained LED light bar 26 is required to be greater than the length of the framework region 21 and greater than the length of the milling groove 22. Therefore, portions of the transparent base at two ends of the LED light bar 26 each are not covered by the packaging adhesive, and conductive electrodes are formed on the exposed portions, and the conductive electrodes are electrically connected to the LED chips covered by the packaging adhesive.

With Reference to FIG. 2E, for the fabricated LED light bar, not only a front surface and a back surface are covered by the packaging adhesive, but also two lateral surfaces are covered by the packaging adhesive filling the milling groove, thereby achieving a packaging technique for a LED light bar surrounded by an adhesive, and solving the problem of lateral-surface light leakage of an conventional LED light bar.

With the method according to the present disclosure, not only the uniformity of lights emitted by an LED light bar is improved, but also the usage amount of fluorescent powder is saved and the cost is reduced.

It should be noted that, in designing the LED light bar, the number of LED chips, the total length of the light bar, the length of the framework region, and the thickness of the package adhesive on the front surface, the back surface and the lateral surfaces of the LED light bar may be designed according to requirements of applications, such as a lamp-wick in a lamp, a backlight light source in a liquid crystal screen of a mobile phone, or a backlight light source in a large liquid crystal screen, etc, and may be adjusted correspondingly by those skilled in the art according to the idea of the present disclosure.

Based on the method for fabricating an LED light bar according to the above embodiment, an LED light bar fabricated based on the method is further provided.

The framework region of the LED light bar according to the embodiment is surrounded by an adhesive.

Specifically, the at least one milling groove and the at least one framework region are arranged alternately, alternatively, two milling grooves are arranged on each of two sides of each one framework region.

It should be noted that, the length of the milling groove is greater than or equal to the length of the framework region.

The milling groove is integrally formed with a transparent base by mould casting, alternatively, the milling groove is formed by post-processing of the transparent base through a grooving process.

The transparent base is one of a transparent glass plate, a transparent resin plate, a sapphire base or a transparent ceramic.

The foregoing embodiments are only preferred embodiments of the disclosure and are not meant to limit the disclosure. The preferred embodiments according to the disclosure are disclosed above, and are not intended to limit the disclosure. Those of skills in the art may make, based on the disclosed method and technical content, some variations and improvements on the technical solutions of the disclosure, or make some equivalent variations on the embodiments without departing from the scope of the technical solutions. All simple modifications, equivalent variations and improvements made based on the technical essence of the disclosure without departing from content of the technical solutions of the disclosure fall in the scope of the technical solutions of the disclosure.

The invention claimed is:

1. A method for fabricating an LED light bar, comprising:
providing a transparent base, wherein at least one framework region for fixing LED chips is arranged on the transparent base, at least one milling groove parallel to the framework region is arranged at each of two sides of each framework region, and the milling groove penetrates through an upper surface and a lower surface of the transparent base;
arranging one or more LED chips on the at least one framework region by a die bonding process, wherein LED chips on a same framework region form an LED chip column;
connecting, in a same LED chip column, a positive electrode of an LED chip to a negative electrode of an LED chip adjacent to the LED chip by a wire bonding process;
covering, by a press molding process, an upper surface and a lower surface of the transparent base where the LED chips are arranged with a packaging adhesive mixed with fluorescent powder, and filling up, by the press molding process, the milling groove with the packaging adhesive under pressure; and
cutting the transparent base along the milling groove after the packaging adhesive is solidified, to obtain an LED light bar surrounded by the adhesive.

2. The method for fabricating the LED light bar according to claim 1, wherein the at least one milling groove and the at least one framework region are arranged alternately, or two milling grooves are arranged on each of two sides of each framework region.

3. The method for fabricating the LED light bar according to claim 1, wherein the length of the milling groove is great than or equal to the length of the framework region.

4. The method for fabricating the LED light bar according to claim 1, wherein the milling groove is integrally formed with the transparent base by mould casting, or the milling groove is formed by post-processing of the transparent base through a grooving process.

5. The method for fabricating the LED light bar according to claim 1, wherein the transparent base is cut along a length direction of the milling groove, and a cutting trajectory coincides with a midline of the milling groove in the length direction.

6. The method for fabricating the LED light bar according to claim 1, wherein the transparent base is one of a transparent glass plate, a transparent resin plate, a sapphire base or a transparent ceramic.

7. An LED light bar comprising:
a transparent base having an upper surface and a lower surface;
at least one framework regions for fixing LED chips arranged on the transparent base, each framework region having two sides;
at least one milling groove parallel to the at least one framework region arranged at each of the two sides of each framework region, the milling groove penetrating through the upper surface and the lower surface of the transparent base;
one or more LED chips arranged on the framework region by a die bonding process, wherein LED chips on a same framework region form an LED chip column;
a positive electrode of an LED chip in the same LED chip column connected to a negative electrode of an LED chip adjacent to the LED chip by a wire bonding process; and
a packaging adhesive mixed with fluorescent powder covering, by a press molding process, the upper surface and the lower surface of the transparent base where the LED chips are arranged, the packaging adhesive filling the at least one milling groove under pressure.

* * * * *